United States Patent
Lan et al.

(10) Patent No.: US 11,557,693 B2
(45) Date of Patent: Jan. 17, 2023

(54) SEMICONDUCTOR LIGHT EMITTING DEVICE

(71) Applicant: XIAMEN SAN'AN OPTOELECTRONICS CO., LTD., Fujian (CN)

(72) Inventors: Yung-Ling Lan, Wuhu (CN); Chan-Chan Ling, Wuhu (CN); Chi-Ming Tsai, Wuhu (CN); Chia-Hung Chang, Wuhu (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 123 days.

(21) Appl. No.: 17/209,485

(22) Filed: Mar. 23, 2021

(65) Prior Publication Data
US 2021/0210654 A1    Jul. 8, 2021

Related U.S. Application Data

(63) Continuation-in-part of application No. 16/716,598, filed on Dec. 17, 2019, now Pat. No. 10,978,612.
(Continued)

(30) Foreign Application Priority Data

Jul. 31, 2017 (CN) .......................... 201710638217.9

(51) Int. Cl.
*H01L 33/06* (2010.01)
*H01L 33/32* (2010.01)
*H01L 33/14* (2010.01)

(52) U.S. Cl.
CPC .............. *H01L 33/06* (2013.01); *H01L 33/14* (2013.01); *H01L 33/32* (2013.01)

(58) Field of Classification Search
None
See application file for complete search history.

(56) References Cited

U.S. PATENT DOCUMENTS

| 2006/0243960 A1* | 11/2006 | Shimizu | H01L 33/32 |
| | | | 257/14 |
| 2008/0095492 A1 | 4/2008 | Son et al. | |
| 2014/0367715 A1 | 12/2014 | Hong | |

FOREIGN PATENT DOCUMENTS

| CN | 102931303 A | 2/2013 |
| CN | 107394019 A | 11/2017 |
| WO | 2017057149 A1 | 4/2017 |

OTHER PUBLICATIONS

Search Report issued to PCT application No. PCT/CN2018/078654 by the CNIPA dated Jun. 19, 2018.
(Continued)

*Primary Examiner* — J. E. Schoenholtz
(74) *Attorney, Agent, or Firm* — Thomas| Horstemeyer, LLP

(57) ABSTRACT

A semiconductor light emitting device includes a multi-quantum-well structure, a first capping layer, a second capping layer, and an electron barrier layer stacked in order. The multi-quantum-well structure includes a plurality of alternately-stacked potential barrier layers and potential well layers. The first capping layer is a semiconductor layer, and the second capping layer is a p-doped semiconductor layer. Each of the first and second capping layers has an aluminum mole fraction larger than that of each of the potential barrier layers, and the aluminum mole fraction of the first capping layer is larger than that of at least a portion of the electron barrier layer. A method for preparing the semiconductor light emitting device is also provided.

20 Claims, 5 Drawing Sheets

Related U.S. Application Data which is a continuation-in-part of application No. 16/426,016, filed on May 30, 2019, now Pat. No. 10,535,796, which is a continuation-in-part of application No. PCT/CN2018/078654, filed on Mar. 12, 2018.

(56) References Cited

OTHER PUBLICATIONS

Search Report appended to an Office Action, which was issued to Chinese counterpart application No. 201710638217.9 by the CNIPA dated Dec. 5, 2018, with an English translation thereof.

* cited by examiner

SEMICONDUCTOR LIGHT EMITTING DEVICE

CROSS-REFERENCE TO RELATED APPLICATION

This application is a continuation-in-part (CIP) of U.S. patent application Ser. No. 16/716,598, filed on Dec. 17, 2019, which is a CIP of U.S. patent application Ser. No. 16/426,016, filed on May 30, 2019, which is a CIP of International Application No. PCT/CN2018/078654, filed on Mar. 12, 2018, which claims priority to Chinese Invention Patent Application No. 201710638217.9, filed on Jul. 31, 2017.

FIELD

The disclosure relates to a semiconductor device, and more particularly to a semiconductor light emitting device and a method for preparing the same.

BACKGROUND

A gallium nitride (GaN)-based light emitting diode (LED) includes a p-type semiconductor layer providing electron holes and an n-type semiconductor layer providing electrons, having between them a P-N junction that converts electrical energy to luminous energy. When electric current passes through the LED in the forward direction, the electrons provided by the n-type semiconductor layer recombines with the electron holes in the p-type semiconductor layer, releasing energy corresponding to the band gap between the conduction band and the valence band. The energy released may either be thermal energy or light, and the light may be emitted outwards.

However, when epitaxially growing the p-type semiconductor layer, growth conditions such as the growth temperature may cause a p-type dopant (e.g. magnesium) to spread to a quantum well structure, thus negatively affecting the material quality of a potential well layer in the quantum well structure. This may, in turn, lower the luminous efficiency of the LED. In addition, how to reduce electron overflow and electron tunneling effect between the n-type semiconductor layer and the p-type semiconductor layer remains a problem to be solved.

SUMMARY

Therefore, the object of the disclosure is to provide a semiconductor light emitting device that can alleviate the drawback of the prior art. A method for preparing the semiconductor light emitting device is also provided.

According to one aspect of the disclosure, a semiconductor light emitting device includes an n-type semiconductor layer, a multi-quantum-well structure, a first capping layer, a second capping layer, an electron barrier layer, a p-type semiconductor layer, and a p-type contact layer stacked in order.

The multi-quantum-well structure includes a plurality of alternately-stacked potential barrier layers and potential well layers.

The first capping layer is one of an undoped semiconductor layer and a p-doped semiconductor layer, and the second capping layer is a p-doped semiconductor layer. The second capping layer is directly formed on the first capping layer. Each of the first and second capping layers has an aluminum mole fraction larger than that of each of the potential barrier layers, and the aluminum mole fraction of the first capping layer is larger than that of at least a portion of the electron barrier layer.

According to another aspect of the disclosure, a method for preparing a semiconductor light emitting device includes:

growing an n-type semiconductor layer on a growth substrate;

growing a multi-quantum-well structure on the n-type semiconductor layer, the multi-quantum-well structure including a plurality of alternately stacked potential barrier layers and potential well layers;

growing a first capping layer on the multi-quantum-well structure, the first capping layer being an undoped layer;

growing directly on the first capping layer a second capping layer, the second capping layer being a p-doped layer with a p-type dopant; and growing an electron barrier layer on the second capping layer; and growing sequentially a p-type semiconductor layer and a p-type contact layer on the electron barrier layer.

The first capping layer has a growth temperature between that of the potential barrier layers and that of the potential well layers. The second capping layer has a growth temperature lower than that of the potential well layers. Each of the first and second capping layers has an aluminum mole fraction larger than that of each of the potential barrier layers, and the aluminum mole fraction of the first capping layer is larger than that of at least a portion of the electron barrier layer.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
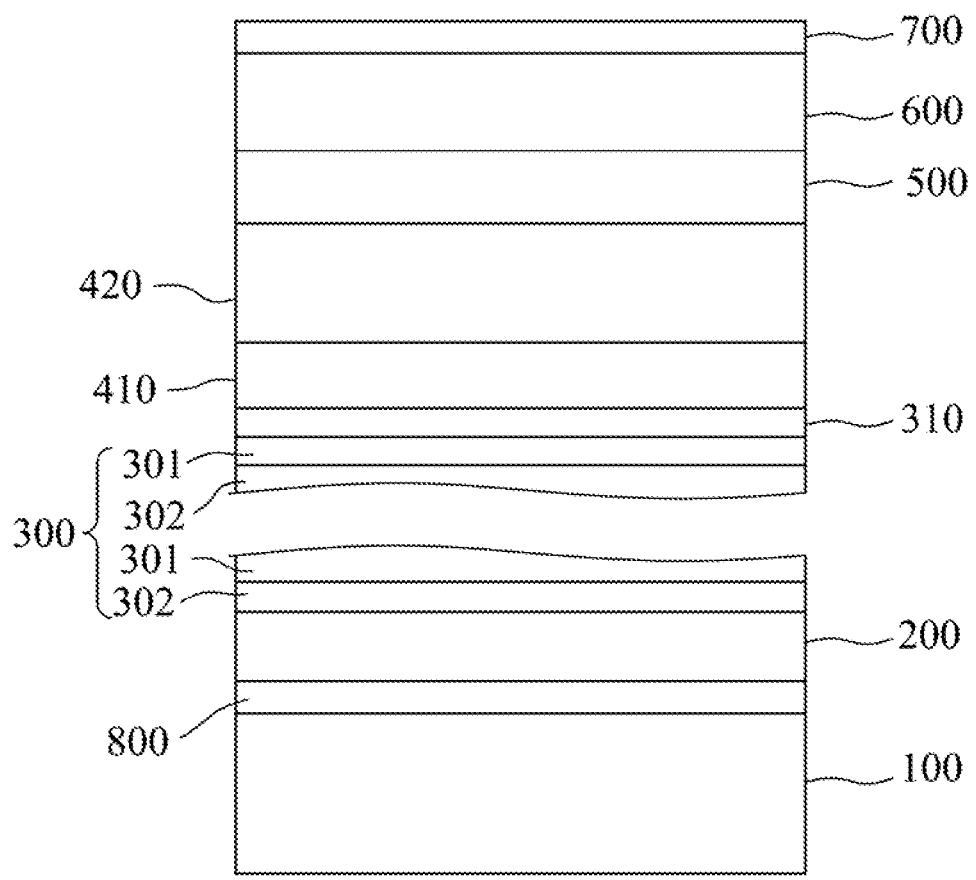
FIG. 1 is a fragmentary schematic sectional view of a first embodiment of a semiconductor light emitting device according to the disclosure.

Referring to FIG. 1, a first embodiment of a semiconductor light emitting device according to the disclosure includes a growth substrate 100, and an n-type semiconductor layer 200, a multi-quantum-well structure 300, a first potential barrier layer 310, a first capping layer 410, a second capping layer 420, an electron barrier layer 500, a p-type semiconductor layer 600, and a p-type contact layer 700 stacked in order on the growth substrate 100.

The growth substrate 100 may be made of one of sapphire, gallium nitride (GaN), and silicon, but is not limited in this respect.

In certain embodiments, in order to reduce the strain caused by lattice mismatch between the growth substrate 100 and the n-type semiconductor layer 200, the semiconductor light emitting device may further include a buffer layer 800 formed between the n-type semiconductor layer 200 and the growth substrate 100. A material for making the buffer layer 800 is selected from the group consisting of aluminum nitride (AlN), GaN, aluminum gallium nitride (AlGaN), aluminum indium gallium nitride (AlInGaN), indium nitride (InN), indium gallium nitride (InGaN), and combinations thereof. In certain embodiments, the buffer layer 800 may be an $Al_{1-x}Ga_xIn_yN$ layer rein x and y represent mole fractions, $0 \leq x < 1$ and $0 \leq y < 1$.

The multi-quantum-well structure 300 includes a plurality of alternately-stacked second potential barrier layers 301 and potential well layers 302. The repetition period of a combination of one of the second potential barriers layers 301 and one of the potential well layers 302 of the multi-quantum-well structure 300 is between 3 and 20. The band gap of each of the second potential barrier layers 301 is larger than that of each of the potential well layers 302. Each of the second potential barrier layers 301 is one of an undoped semiconductor layer and an n-doped semiconductor layer.

The first potential barrier layer 310 is an undoped semiconductor layer having one of a single-layer structure and a multi-layered structure. In certain embodiments, the first potential barrier layer 310 may be an undoped GaN (u-GaN) layer, an undoped AlGaN (u-AlGaN) layer, a u-GaN/u-AlGaN multi-layered structure, or an undoped InGaN/undoped AlInGaN/u-AlGaN multi-layered structure.

The first capping layer 410 is formed for reducing the spreading of p-type doping materials in the second capping layer 420, the electron barrier layer 500 and the p-type semiconductor layer 600 to the multi-quantum-well structure 300 which may cause a reduction of the luminous efficiency of the semiconductor light emitting device. The first capping layer 410 may be an undoped semiconductor layer. However, in certain embodiments, the first capping layer 410 may be a p-doped semiconductor layer which is formed due to diffusion of a p-type dopant in the second capping layer 420. Specifically, the first capping layer 410 is intended to be undoped, but due to the possible epitaxial defects in the first capping layer 410, the p-type dopant in the second capping layer 420 may diffuse into the first capping layer 410 and dope the first capping layer 410.

The second capping layer 420 is a p-doped semiconductor layer doped with the p-type dopant as mentioned above. The second capping layer 420 is directly formed on the first capping layer 410. The second capping layer 420 has a p-type doping concentration higher than that of the p-type semiconductor layer 600 and lower than that of the p-type contact layer 700. The high level of p-type doping increases electron hole injection effect and allows the second capping layer 420 to act as a hole injection layer. Specifically, the second capping layer 420 has a p-type doping concentration ranging between $1 \times 10^{19}$ $cm^{-3}$ and $5 \times 10^{20}$ $cm^{-3}$. In certain embodiments, the second capping layer 420 has a p-type doping concentration ranging between $5 \times 10^{19}$ $cm^{-3}$ and $2 \times 10^{20}$ $cm^{-3}$. The second capping layer 420 has a thickness larger than that of each of the potential well layers 302 of the multi-quantum-well structure 300. Specifically, the second capping layer 420 has a thickness less than 40 nm.

Each of the first and second capping layers 410, 420 have a band gap larger than that of each of the second potential barrier layers 301. The second capping layer 420 has a band gap not larger than the electron barrier layer 500. The larger band gap of each of the first and second capping layers 410, 420 reduces the electron overflow and increases the hole injection effect.

In certain embodiments, the first capping layer 410 is an undoped $Al_xN$ layer or a p-doped $Al_xN$ layer, wherein x represents aluminum mole fraction and x=1; the second capping layer 420 is a p-doped $Al_xGa_{(1-x)}N$ layer, wherein x represents aluminum mole fraction. The aluminum mole fraction of the first capping layer 410 is larger than that of the second capping layer 420.

Each of said first and second capping layers 410, 420 has an aluminum mole fraction that is larger than that of each of the second potential barrier layers 301. The aluminum mole fraction of the first capping layer 410 is larger than that of at least a portion of the electron barrier layer 500. In the first embodiment, the aluminum mole fraction of the first capping layer 410 is larger than that of the electron barrier layer 500.

In the first embodiment, the electron barrier layer 500 is an AlGaN-containing layer having an aluminum mole fraction ranging from 0.02 to 0.25, which is less than that of the first capping layer 410. To be specific, the electron barrier layer 500 is an $Al_xGa_{(1-x)}N$ layer, wherein $0.02 \leq x \leq 0.25$, and may be doped with p-type impurity using ion implantation technique. In this embodiment, the electron barrier layer 500 has an aluminum content which decreases in a direction from the multi-quantum-well structure 300 to the p-type contact layer 700.

In certain embodiments, the second capping layer 420 is an AlGaInN-containing layer having an aluminum mole fraction not larger than that of the electron barrier layer 500. To be specific, the second capping layer 420 is an $Al_xGa_{(1-x)}In_yN$ layer, wherein x and y represent mole fractions, $0 \leq x < 1$ and $0 \leq y < 1$. However, since the second capping layer 420 has a thickness larger than that of the electron blocking layer 500, a total aluminum content of the second capping layer 420 is larger than that of the electron blocking layer 500.

Figure 2:
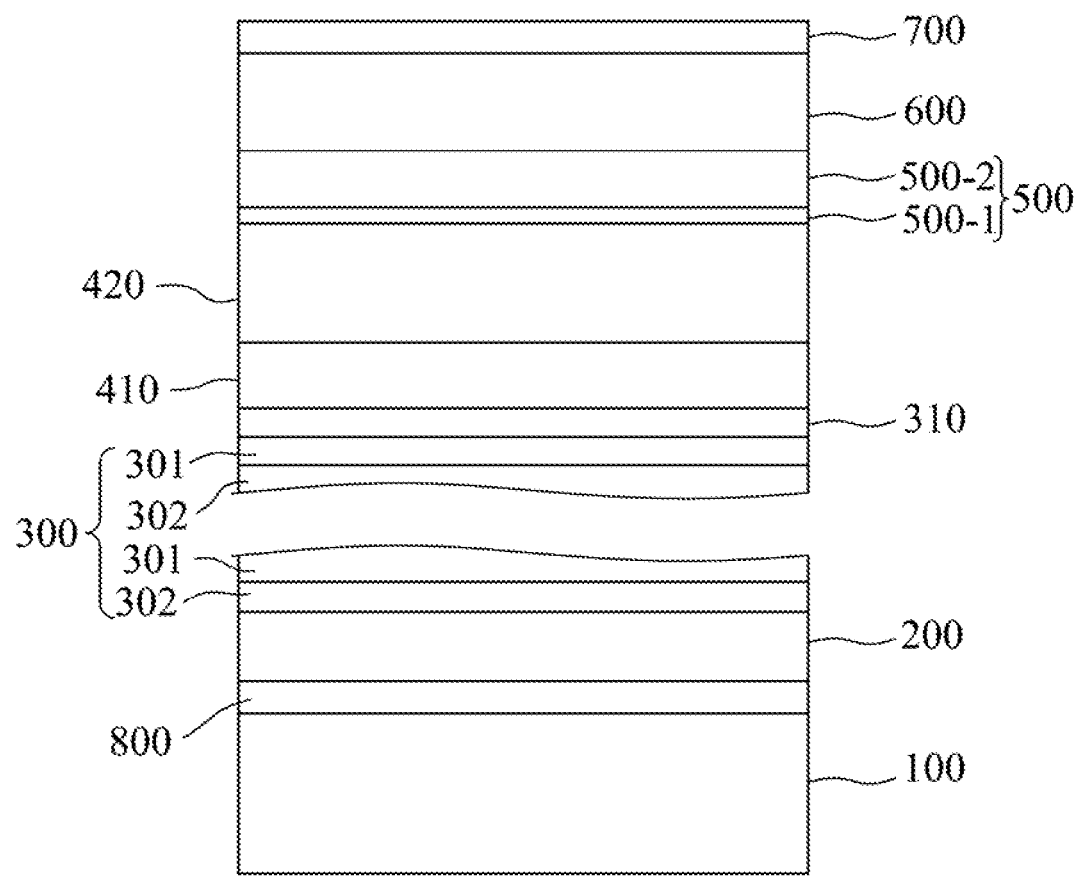
FIG. 2 is a fragmentary schematic sectional view of a second embodiment of a semiconductor light emitting device according to the disclosure.

Referring to FIG. 2, a second embodiment of the semiconductor light emitting device according to the disclosure is shown to be generally similar to the first embodiment, except that in the second embodiment, the electron barrier layer 500 includes a first electron barrier sublayer 500-1 and a second electron barrier sublayer 500-2 that are sequentially formed on the second capping layer 420 in such order. In the second embodiment, the first electron barrier sublayer 500-1 is an AlN-containing sublayer. The first electron barrier sublayer 500-1 may be an AlN layer, wherein x=1. The second electron barrier sublayer 500-2 is an AlGaN-containing sublayer. The second electron barrier sublayer 500-2 may be an $Al_xGa_{1-x}N$ layer, wherein $0 < x \leq 0.35$. The second electron barrier sublayer 500-2 has a thickness larger than that of the first electron barrier sublayer 500-1. The first electron barrier sublayer 500-1 has an aluminum mole fraction that is higher than that of the second electron barrier sublayer 500-2. The first capping layer 410 has an aluminum mole fraction that is larger than that of the second electron barrier sublayer 500-2.

Figure 3:
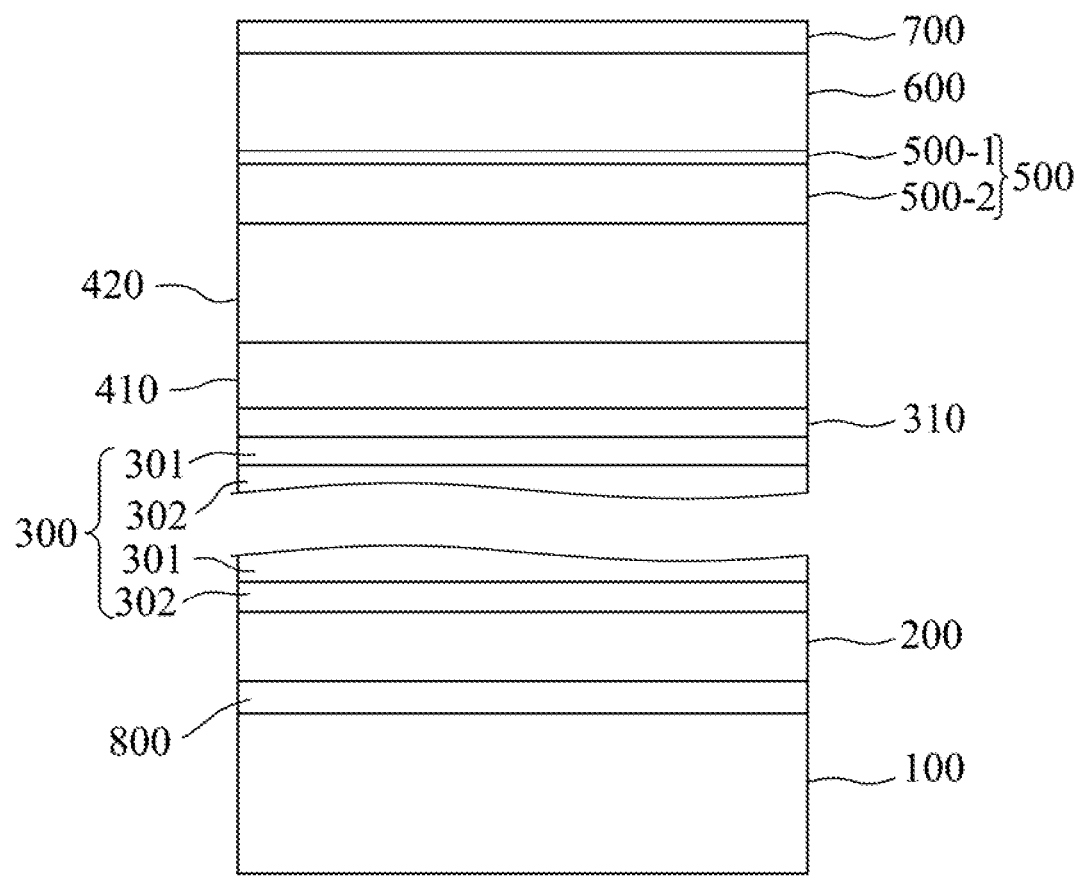
FIG. 3 is a fragmentary schematic sectional view of a third embodiment of a semiconductor light emitting device according to the disclosure.

Referring to FIG. 3, a third embodiment of the semiconductor light emitting device according to the disclosure is shown to be generally similar to the second embodiment, except that in the third embodiment, the second electron barrier sublayer 500-2 and the first electron barrier sublayer 500-1 are sequentially formed on the second capping layer 420 in such order.

Figure 4:
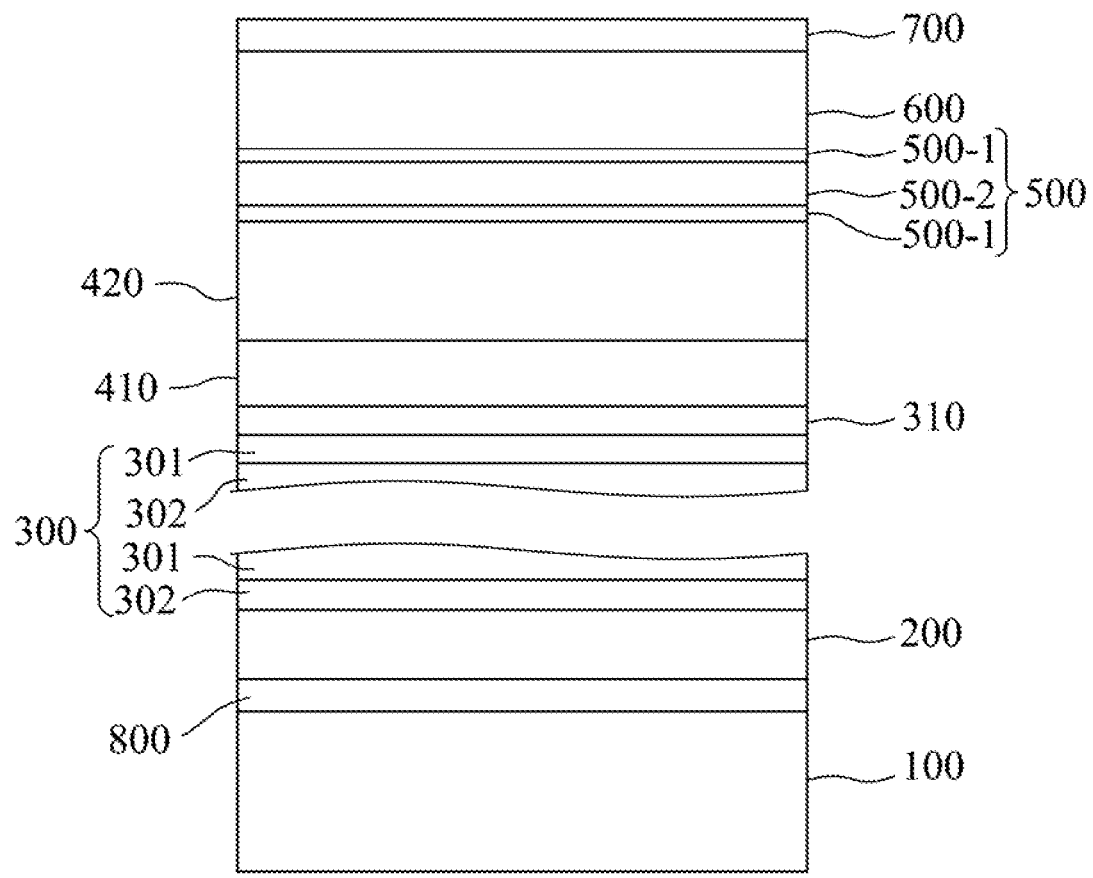
FIG. 4 is a fragmentary schematic sectional view of a fourth embodiment of a semiconductor light emitting device according to the disclosure.

Referring to FIG. 4, a fourth embodiment of the semiconductor light emitting device according to the disclosure is shown to be generally similar to the second embodiment, except that in the fourth embodiment, the electron barrier layer 500 further includes a third electron barrier sublayer 500-3 formed on the second electron barrier sublayer 500-2 opposite to the first electron barrier sublayer 500-1. In the fourth embodiment, the third electron barrier sublayer 500-3 is an AlN-containing sublayer that has a thickness and an aluminum mole fraction similar to those of the first electron barrier sublayer 500-1. To be specific, the third electron barrier sublayer 500-3 may be an $Al_xN$ layer, wherein x=1. Each of the first and third electron barrier sublayers 500-1, 500-3 has an aluminum mole fraction larger than that of the second electron barrier sublayer 500-2, and the aluminum mole fraction of the first capping layer 410 is larger than that of the second electron barrier sublayer 500-2. In addition, each of the first and third electron barrier sublayers 500-1, 500-3 has a thickness less than that of the second electron barrier sublayer 500-2, and at least one of the first and third electron barrier sublayers 500-1, 500-3 has a thickness less than 5 nm.

Figure 5:
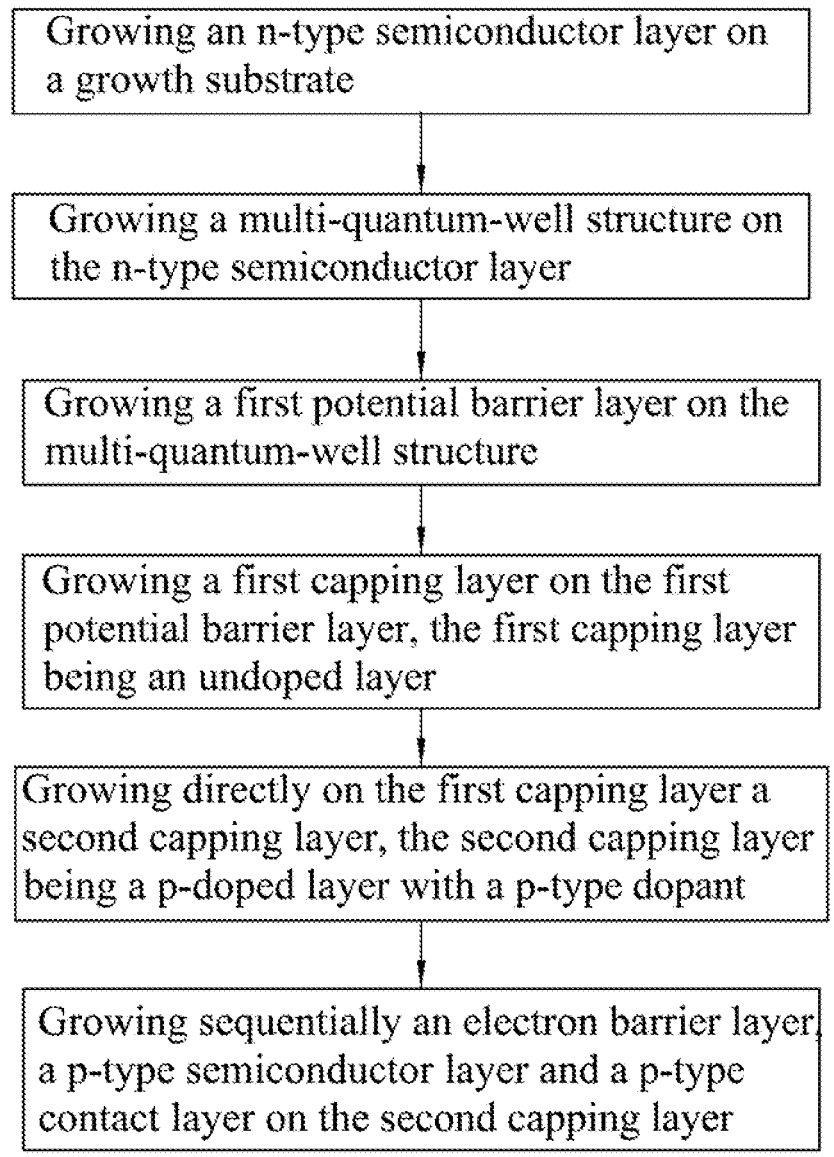
FIG. 5 is a process flow diagram of an embodiment of a method of preparing a semiconductor light emitting device according to the disclosure.

Referring to FIG. 5, an embodiment of a method for preparing the first embodiment of the semiconductor light emitting device of the present disclosure includes growing the n-type semiconductor layer 200 on the growth substrate 100, growing the multi-quantum-well structure 300 including a plurality of alternately stacked second potential barrier layers 301 and potential well layers 302 on the n-type semiconductor layer 200, growing the first potential barrier layer 310 on the multi-quantum-well structure 300, growing the first capping layer 410 being an undoped layer on top of the first potential barrier layer 310, growing the second capping layer 420 being a p-doped layer with a p-type dopant directly on the first capping layer 410, growing the electron barrier layer 500 on the second capping layer 420, and growing sequentially the p-type semiconductor layer 600 and the p-type contact layer 700 on the electron barrier layer 500.

For certain embodiments, in which the first capping layer 410 has epitaxial defects, during growth of the second capping layer 420, the p-type dopant may diffuse into the first capping layer 410 so that the first capping layer 410 becomes a p-doped semiconductor layer.

The n-type semiconductor layer 200, the multi-quantum-well structure 300, the first capping layer 410, the second capping layer 420, the electron barrier layer 500, the p-type semiconductor layer 600 and the p-type contact layer 700 are grown using epitaxial technique.

In certain embodiments, the method further includes growing the buffer layer 800 on the growth substrate 100 before growth of the n-type semiconductor layer 200.

Each of the potential well layers 302 has a growth temperature lower than that of each of the second potential barrier layers 301. The first potential barrier layer 310 has a growth temperature equal to that of each of the second potential barrier layers 301.

The first capping layer 410 has a growth temperature between that of the second potential barrier layers 301 and that of the potential well layers 302, and the second capping layer 420 has a growth temperature lower than that of the potential well layers 302. The low growth temperature of each of the first and second capping layers 410, 420 relative to the second potential barrier layers 301 prevents lowering of the crystal quality of the multi-quantum-well structure 300 and spreading of the p-type impurity. However, the quality of the first and second capping layer 410, 420, especially the second capping layer 420 whose growth temperature is lower than that of each of the potential well layers 302, may be negatively affected by the lower growth temperature, and thus the second capping layer 420 has a thickness less than 40 nm. However, the thickness of the second capping layer 420 may affect the properties of the light emitting device and should be controlled within a desired range. In certain embodiments, the thickness of the second capping layer 420 is between 200 Å to 350 Å, and the thickness of the first capping layer 410 is between 2 Å to 10 Å.

The method for preparing the second embodiment of the semiconductor light emitting device of the present disclosure is generally similar to that for preparing the first embodiment of the semiconductor light emitting device, except that the electron barrier layer 500 is grown by first growing the first electron barrier sublayer 500-1 on the second capping layer 420 and then growing the second electron barrier sublayer 500-2 on the first electron barrier sublayer 500-1.

The method for preparing the third embodiment of the semiconductor light emitting device of the present disclosure is generally similar to that for preparing the second embodiment of the light emitting device, except that the electron barrier layer 500 is grown by first growing the second electron barrier sublayer 500-2 on the second capping layer 420 and then growing the first electron barrier sublayer 500-1 on the second electron barrier sublayer 500-2.

The method for preparing the fourth embodiment of the semiconductor light emitting device of the present disclosure is generally similar to that for preparing the second embodiment of the light emitting device, except that the step of growing the electron barrier layer 500 further includes growing the third electron barrier sublayer 500-3 on the second electron barrier sublayer 500-2.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:
1. A semiconductor light emitting device, comprising:
an n-type semiconductor layer, a multi-quantum-well structure, a first capping layer, a second capping layer, an electron barrier layer, a p-type semiconductor layer, and a p-type contact layer stacked in order, wherein said multi-quantum-well structure includes a plurality of alternately-stacked potential barrier layers and potential well layers; and wherein said first capping layer is one of an undoped semiconductor layer and a p-doped semiconductor layer, said second capping layer being a p-doped semiconductor layer, said second capping layer being directly formed on said first capping layer, wherein each of said first and second capping layers has an aluminum mole fraction larger than that of each of said potential barrier layers, the aluminum mole fraction of said first capping layer being larger than that of at least a portion of said electron barrier layer.

2. The semiconductor light emitting device as claimed in claim 1, wherein said electron barrier layer is an aluminum gallium nitride (AlGaN)-containing layer having an aluminum mole fraction ranging from 0.02 to 0.25, which is less than that of said first capping layer.

3. The semiconductor light emitting device as claimed in claim 1, wherein said electron barrier layer includes a first electron barrier sublayer and a second electron barrier sublayer.

4. The semiconductor light emitting device as claimed in claim 3, wherein said first electron barrier sublayer is an aluminum nitride (AlN)-containing sublayer, and said second electron barrier sublayer is an AlGaN-containing sublayer.

5. The semiconductor light emitting device as claimed in claim 4, wherein said second electron barrier sublayer has a thickness larger than that of said first electron barrier sublayer.

6. The semiconductor light emitting device as claimed in claim 4, wherein said first electron barrier sublayer has an aluminum mole fraction larger than that of said second electron barrier sublayer.

7. The semiconductor light emitting device as claimed in claim 3, wherein the aluminum mole fraction of said first capping layer is larger than that of said second electron barrier sublayer.

8. The semiconductor light emitting device as claimed in claim 1, wherein said first capping layer is one of an undoped aluminum nitride (AlN) layer and a p-doped AlN layer, and said second capping layer is a p-doped AlGaN layer.

9. The semiconductor light emitting device as claimed in claim 8, wherein the aluminum mole fraction of said first capping layer is larger than that of said second capping layer.

10. The semiconductor light emitting device as claimed in claim 1, wherein said second capping layer has a thickness larger than that of each of said potential well layers of said multi-quantum-well structure.

11. The semiconductor light emitting device as claimed in claim 1, wherein said second capping layer has a p-type doping concentration higher than that of said p-type semiconductor layer and lower than that of said p-type contact layer.

12. The semiconductor light emitting device as claimed in claim 1, wherein said second capping layer has a p-type doping concentration between $1 \times 10^{19}$ cm$^{-3}$ and $5 \times 10^{20}$ cm$^{-3}$.

13. The semiconductor light emitting device as claimed in claim 1, wherein said second capping layer has a thickness less than 40 nm.

14. The semiconductor light emitting device as claimed in claim 2, wherein said second capping layer is an aluminum gallium indium nitride (AlGaInN)-containing layer having an aluminum mole fraction not larger than that of said electron barrier layer.

15. The semiconductor light emitting device as claimed in claim 3, wherein said first electron barrier sublayer has a thickness less than that of said second electron barrier sublayer.

16. The semiconductor light emitting device as claimed in claim 1, further comprising a growth substrate formed on said n-type semiconductor layer opposite to said multi-quantum-well structure, and a buffer layer formed between said n-type semiconductor layer and said growth substrate, said buffer layer being made from a material selected from the group consisting of AlN, gallium nitride (GaN), AlGaN, aluminum indium gallium nitride (AlInGaN), indium nitride (InN), indium gallium nitride (InGaN), and combinations thereof.

17. The semiconductor light emitting device as claimed in claim 1, wherein each of said potential barrier layers is one of an undoped semiconductor layer and an n-doped semiconductor layer.

18. The semiconductor light emitting device as claimed in claim 1, wherein said electron barrier layer includes a first electron barrier sublayer, a second electron barrier sublayer, and a third electron barrier sublayer, wherein each of said first and third electron barrier sublayers has an aluminum mole fraction larger than that of said second electron barrier sublayer, and the aluminum mole fraction of said first capping layer is larger than that of said second electron barrier sublayer.

19. The semiconductor light emitting device as claimed in claim 18, wherein each of said first and third electron barrier sublayers has a thickness less than that of said second electron barrier sublayer.

20. The semiconductor light emitting device as claimed in claim 19, wherein at least one of said first and third electron barrier sublayers has a thickness less than 5 nm.

* * * * *